United States Patent

Hayashi et al.

[11] Patent Number: 5,428,224
[45] Date of Patent: Jun. 27, 1995

[54] FIELD EFFECT TRANSISTOR

[75] Inventors: Kazuo Hayashi; Takuji Sonoda, both of Itami, Japan

[73] Assignee: Mitsubishi Denki Kabushiki Kaisha, Tokyo, Japan

[21] Appl. No.: 144,483

[22] Filed: Oct. 28, 1993

Related U.S. Application Data

[63] Continuation of Ser. No. 921,085, Jul. 29, 1992, abandoned.

[30] Foreign Application Priority Data

Sep. 5, 1991 [JP] Japan .................. 3-225663

[51] Int. Cl.⁶ .................. H01L 29/161; H01L 29/205
[52] U.S. Cl. .................. 257/25; 257/14; 257/24; 257/280; 257/282; 257/283
[58] Field of Search .................. 257/24, 25, 280, 282, 257/283, 14

[56] References Cited

U.S. PATENT DOCUMENTS

| | | | |
|---|---|---|---|
| 4,825,264 | 4/1989 | Inata et al. | 357/4 |
| 5,111,255 | 5/1992 | Kiely et al. | 257/24 |
| 5,162,877 | 11/1992 | Mori | 257/25 |

FOREIGN PATENT DOCUMENTS

| | | |
|---|---|---|
| 0107039 | 5/1984 | European Pat. Off. . |
| 0357248 | 3/1990 | European Pat. Off. . |
| 62-211963 | 9/1987 | Japan . |
| 2211963 | 9/1987 | Japan . |
| 63-318782 | 12/1988 | Japan . |
| 3318782 | 12/1988 | Japan . |

OTHER PUBLICATIONS

"Resonant tunneling transistor with quantum well base and high-energy injection: A new negative differential resistance device", by Federico Capasso and Richard A. Kiehl; J. Appl. Phy. 58(3), pp. 1366-1368; 1 Aug. 1985.
"Resonant-Tunnelling Hot-Electron Transistor (RHET) Using a GaInAs/(AlGa) InAs Heterostructure" by K. Imamura et al.; Electronics Letters; vol. 23, No. 17, pp. 870-871; 13 Aug. 1987.

*Primary Examiner*—Rolf Hille
*Assistant Examiner*—Valencia Martin Wallace
*Attorney, Agent, or Firm*—Leydig, Voit & Mayer

[57] ABSTRACT

A field effect transistor with improved operation speed and reduced noise includes a drain electrode disposed on a channel layer with a contact layer interposed therebetween, a source electrode, and a gate electrode disposed between the drain and source electrodes. A resonant tunneling diode is disposed between the source electrode and the channel region for supplying hot electrons to the channel layer beneath the gate electrode.

15 Claims, 5 Drawing Sheets

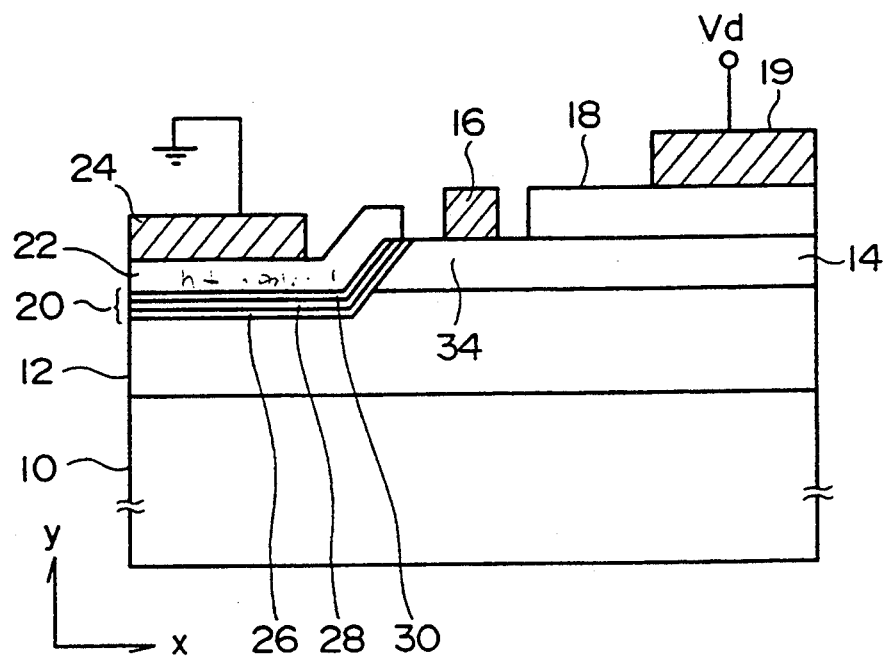
F I G. 3
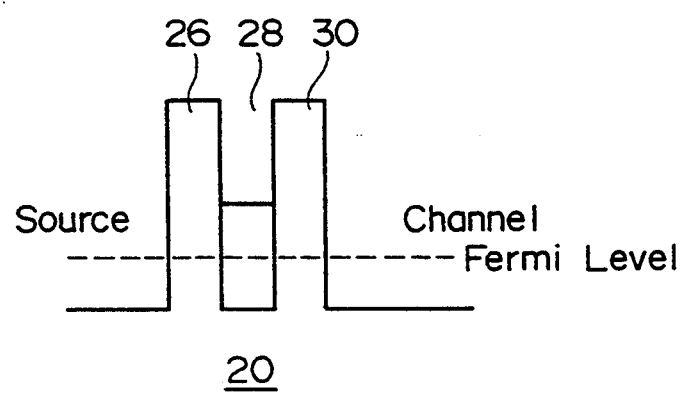
F I G. 4

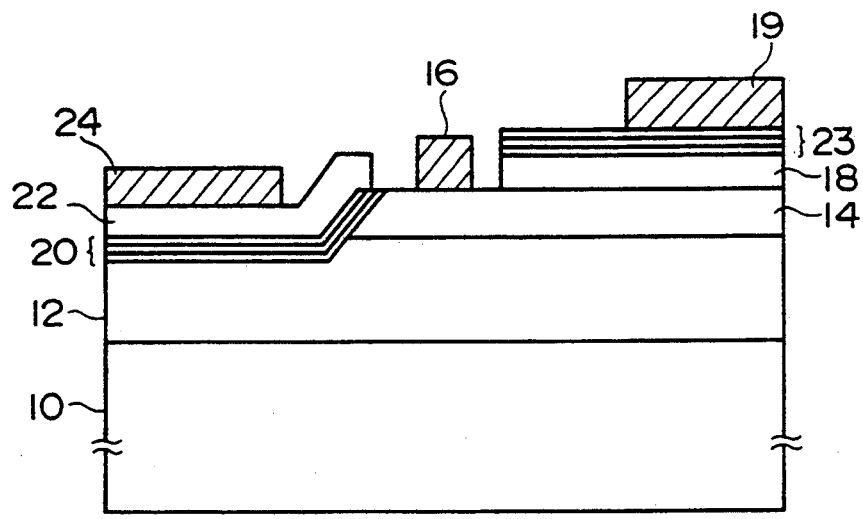
F I G. 7
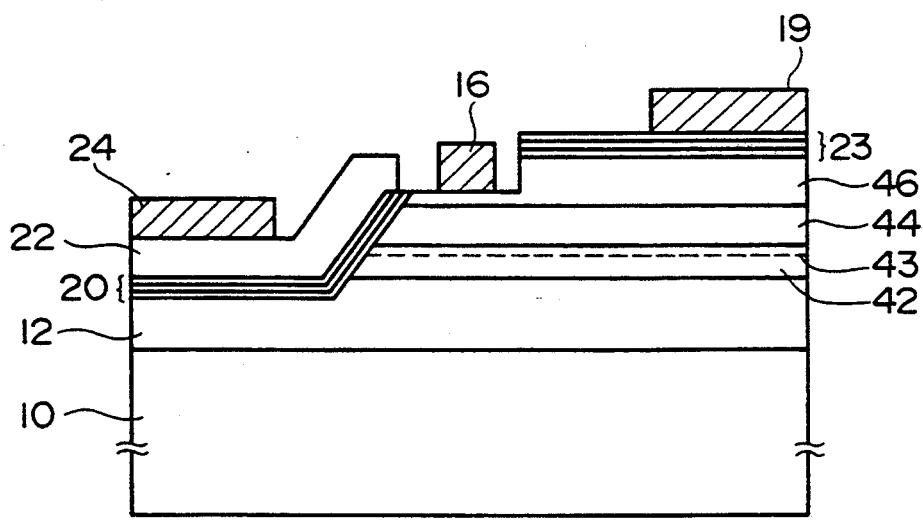
F I G. 8

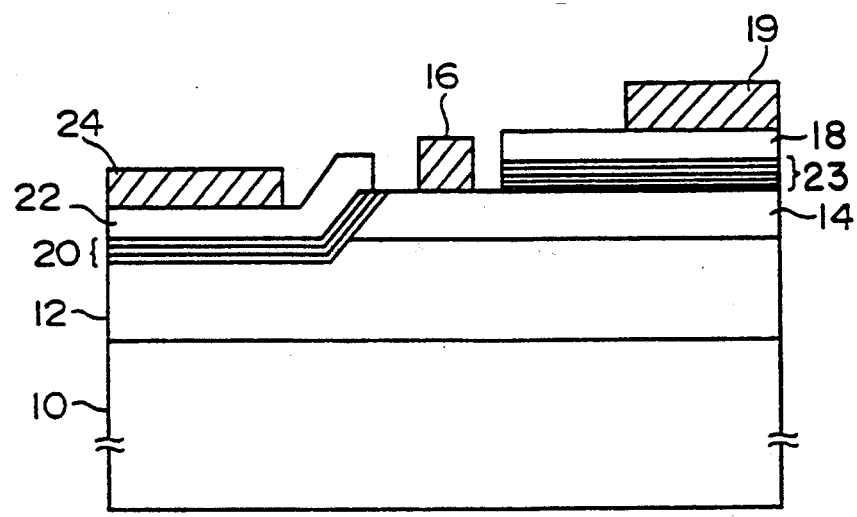
F I G . 9

FIELD EFFECT TRANSISTOR

This disclose is a continuation of application Ser. No. 07/921,085, filed Jul. 29, 1992 now abandoned.

This invention relates to a field effect transistor (FET) and more particularly to an FET with a resonant tunneling diode (RTD) disposed between the source electrode and the channel region beneath the gate electrode.

BACKGROUND OF THE INVENTION

FIG. 1 is a cross-sectional view of a Schottky gate field effect transistor (hereinafter referred to as MESFET) which is shown as a first example of conventional field effect transistors. In FIG. 1, on a semi-insulating semiconductor substrate 1 of, for example, GaAs, a high-resistivity buffer layer 2 is disposed, and an n-type channel layer 3 doped with, for example, Si is disposed on the high-resistivity buffer layer 2. A gate electrode 4 is disposed on the n-type channel layer 3, with $n^+$-type contact layers 51 and 52 disposed on the opposite sides of the gate electrode 4. A source electrode 6 is disposed on the $n^+$-type contact layer 51, and a drain electrode 7 is disposed on the $n^+$-type contact layer 52, Another example of conventional field effect transistors is shown in FIG. 2, which is a cross-sectional view of a heterojunction field effect transistor (HFET). As in the case of MESFET shown in FIG. 1, the HFET of FIG. 2 includes a semi-insulating semiconductor substrate 1 of, for example, GaAs, and a high-resistivity buffer layer 2 disposed on the substrate 1. Different from the MESFET of FIG. 1, however, an undoped channel layer 32 is disposed on the high-resistivity buffer layer 2. For example, a Si-doped $n^+$-type electron supply layer 8 is disposed on the undoped channel layer 3, and an $n^+$-type contact layer 5 is disposed on the electron supply layer 8.

A broken line 33 shown passing through the undoped channel layer 32 in FIG. 2 denotes a two-dimensional electron gas formed by electrons which are supplied from the large bandgap, small electron-affinity $n^+$-type electron supply layer 8 to the channel layer 32 having a small bandgap relative to that of the layer 8 and having a large electron-affinity, and confined in a potential well in the channel layer 32 due to quantum mechanical effects. In a central portion of the $n^+$-type contact layer 5, a recess 9 is formed, and a gate electrode 4 is disposed in the recess 9. On the $n^+$-type contact layer 5, a source electrode 6 and a drain electrode 7 are disposed on the opposite sides of the gate electrode 4.

Under a normal biasing condition, each of the MESFET in FIG. 1 and the HFET in FIG. 2 has its source electrode 6 grounded and has its drain electrode 7 supplied with a positive bias voltage $V_d$. Under such a condition, the speed of electrons supplied from the source to the channel region immediately beneath the gate is dependent on a potential $V_1$ at the source side of the channel region 31. The potential $V_1$ is dependent on a drain current $I_d$, which is the result of drifting of electrons caused by the potential $V_d$ at the drain electrode 7, and on a parasitic resistance $R_s$ between the source electrode 6 and the source side of the channel region 31, i.e. $V_1 = I_d \times R_s$. In an ordinary FET in which the width of a gate electrode is on the order of 200 μm, the drain current $I_d$ and the parasitic resistance $R_s$ may be about 10 mA and about 2 Ω, respectively, and, accordingly, the potential $V_1$ may be about 0.02 V. This voltage is too low to accelerate electrons entering into the part beneath the gate. Thus, in conventional devices, the initial speed of electrons supplied to the channel region immediately beneath the gate is low, which makes it difficult to realize high speed MESFET operation.

In the HFET of FIG. 2, electrons are confined within a potential well in the channel layer 32, and the degree of freedom of electrons in the y direction is lost due to the hetero-barrier formed between the channel layer 32 and the $n^+$-type electron supply layer 8 so that scattering of electrons in the y direction will decrease and the operation speed may be more or less improved in comparison with the MESFET shown in FIG. 1. However, the operation speed attained is still insufficient.

The operation speed could be improved by increasing the potential $V_1$ in the source side of the channel region 31 immediately beneath the gate for both the MESFET of FIG. 1 and the HFET of FIG. 2 so that the initial speed of electrons supplied to the channel increases. However, when $I_d$ and $R_s$ are increased in order to increase $V_1$, lattice vibration are also increased, which results in an increase in thermal noise. Thus, the noise figure NF of the FET's is degraded. Furthermore, because electrons supplied to the channel have various energy levels, they are subjected to various scattering. Therefore it is difficult to realize FET's with a high initial electron velocity in the channel region immediately beneath the gate and with low noise.

FET's which can be operated at high speed include FET's disclosed in Japanese Unexamined Patent Publication No. SHO 63-318782 and Japanese Unexamined Patent Publication No. SHO 62-211963. These FET's take advantage of so-called resonant tunneling. The FET disclosed in Japanese Unexamined Patent Publication No. SHO 63-318782 is an MESFET, of which the drain current ($I_D$) versus source-drain voltage ($V_{DS}$) characteristic exhibits a negative resistance. The FET shown in Japanese Unexamined Patent Publication No. SHO 62-211963 is an HFET which exhibits a peak drain current $I_D$ when a particular gate voltage is applied.

Due to resonant tunneling, the FET's disclosed in the above-mentioned Japanese unexamined patent publications can operate at a more or less higher speed. However, a resonant tunneling diode (RTD) in the source electrode side which provides the resonant tunneling effect is disposed on the channel layer parallel to the channel, so that hot electrons supplied through the RTD into the channel have not only a component of motion in the x direction which is parallel to the channel but also a component in the y direction which is perpendicular to the channel. Accordingly, hot electrons supplied to the channel are scattered during their travel to the portion of the channel immediately beneath the gate, and, therefore, a sufficiently high speed cannot be attained.

As discussed above, because electrons injected into the channel of conventional FET's are subject to various scattering, the initial speed of electrons entering into the channel immediately beneath the gate is insufficient, which impedes increasing operation speed and reducing noise.

The object of the present invention is to provide a FET which can operate at a high speed and with low noise, by eliminating disadvantages discussed above.

SUMMARY OF THE INVENTION

According to a first aspect of the present invention, an MESFET is provided, which includes a semi-insulating semiconductor substrate, a high-resistivity buffer layer disposed on the substrate, an n-type channel layer disposed on the buffer layer, a gate electrode disposed on the n-type channel layer, a source electrode, and a drain electrode. A resonant tunneling diode (RTD) is disposed at least between the source electrode and a channel region beneath the gate electrode to supply hot electrons to the channel region immediately beneath the gate electrode. The source electrode is disposed on the resonant tunneling diode with a contact layer interposed therebetween.

According to a second aspect of the present invention, an HFET is provided, which includes a semi-insulating semiconductor substrate, a high-resistivity buffer layer disposed on the substrate, a smaller bandgap, undoped channel layer disposed on the buffer layer, a larger bandgap, electron supply layer doped to have the n-type conductivity and disposed on the undoped channel layer, gate and drain electrodes disposed on the electron supply layer with a contact layer disposed therebetween, and a source electrode. A resonant tunneling diode (RTD) is disposed at least between the source electrode and a channel region beneath the gate electrode to supply hot electrons to the channel region immediately beneath the gate electrode. The source electrode is disposed on the resonant tunneling diode with a contact layer interposed therebetween.

An advantage of an FET according to the first aspect of the invention is that the RTD between the source and gate electrodes cause hot electrons to be supplied to the channel region immediately beneath the gate electrode so that the initial speed of electrons in the x direction, which is parallel to the direction of the channel, is large. Thus, the speed of electrons moving through the channel is high and the FET can operate at a high speed.

In a FET according to the second aspect of the present invention, the initial speed of electrons supplied to the channel region immediately beneath the gate electrode is high in the x or channel-extending direction, as in the first FET. In addition, electrons within the undoped channel layer are two-dimensionally confined in a potential well in the channel layer due to the quantum mechanical effect and, therefore, their scattering is prevented. Thus, electrons are further accelerated toward the drain electrode to thereby achieve higher operating speed.

BRIEF DESCRIPTION OF THE INVENTION

FIG. 3 is a simplified cross-sectional view of a field effect transistor according to a first embodiment of the present invention;

FIG. 4 is an energy band diagram of a resonant tunneling diode (RTD) in its thermal equilibrium state used in the field effect transistors of the present invention:

FIG. 7 is a simplified cross-sectional view of a field effect transistor according to a third embodiment of the present invention:

FIG. 8 is a simplified cross-sectional view of a field effect transistor according to a fourth embodiment of the present invention; and FIG. 9 is a simplified cross-sectional view of a field effect transistor according to a fifth embodiment of the present invention.

DETAILED DESCRIPTION OF PREFERRED EMBODIMENTS

Figure 1:
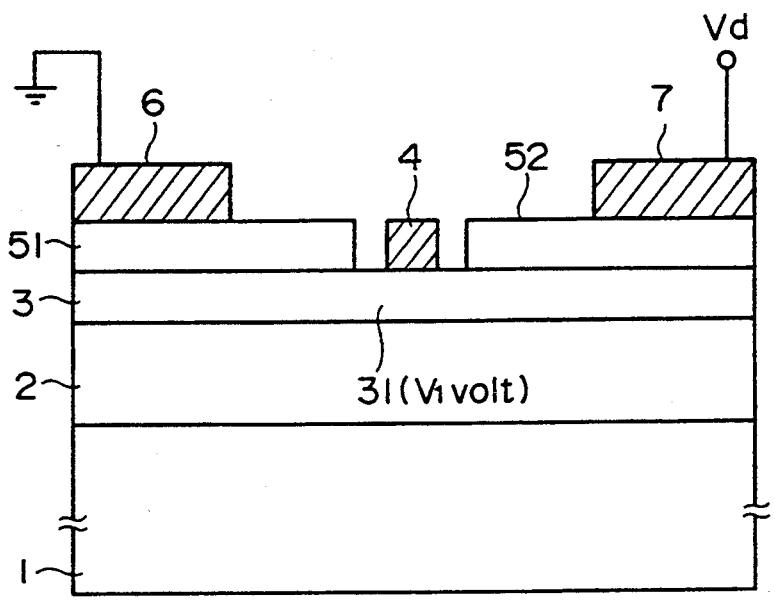
FIG. 1 is a simplified cross-sectional view of a first example of conventional field effect transistors.

FIG. 3 shows a first embodiment of the present invention. The field effect transistor (FET) shown in FIG. 3 is an MESFET (or Schottky gate field effect transistor). A high-resistivity buffer layer 12 is disposed on a semi-insulating semiconductor substrate 13 of, for example, GaAs. On a portion of the surface of the high-resistivity buffer layer 12, an n-type channel layer 14 of, for example, a n-type GaAs is disposed. A gate electrode 16 is disposed on the n-type channel layer 14. Also disposed on the n-type channel layer 14 is an n+-type contact layer 18. A drain electrode 19 is disposed on the n+-type contact layer 18. The n+-type contact layer 18 minimizes the ohmic resistance between the drain electrode 19 and the n-type channel layer 14.

On the remainder of the high-resistivity buffer layer 12, a resonant tunneling diode (RTD) 20 is disposed. The end portion of the RTD 20 adjacent to the channel layer 14 extends obliquely from the high-resistivity buffer layer 12, contacting the end surface of the n-type channel layer 14, as shown in FIG. 3. It is desirable that the RTD 20 to extend perpendicular to the top and bottom surfaces of the n-type channel layer 14, but, for manufacturing reasons, the RTD 20 is fabricated to extend to contact an end surface of the channel layer 14 obliquely. An n+-type contact layer 22 is disposed on the RTD 20, and a source electrode 24 is disposed on the n+-type contact layer 22. Similar to the contact layer 18, the contact layer 22 minimizes the ohmic resistance between the source electrode 24 and the n-type channel layer 14.

As is understood from the energy band diagram shown in FIG. 4, the RTD 20 comprises a three-layered structure which includes barrier layers 26 and 30 of, for example, n+-type AlGaAs, and a potential well layer 28 of, for example, undoped GaAs. Alternatively, the RTD 20 may have an MIM structure which includes metal layers corresponding to the barrier layers 26 and 30, and a dielectric layer disposed between the metal layers. The barrier layers 26 and 30 of the RTD 20 have a thickness which is nearly equal to the quantum mechanical wavelength of electrons (about 100 Å), and the thickness of the potential well layer 28 interposed between the barrier layers is also approximately equal to the quantum mechanical wavelength of electrons.

Figure 5:
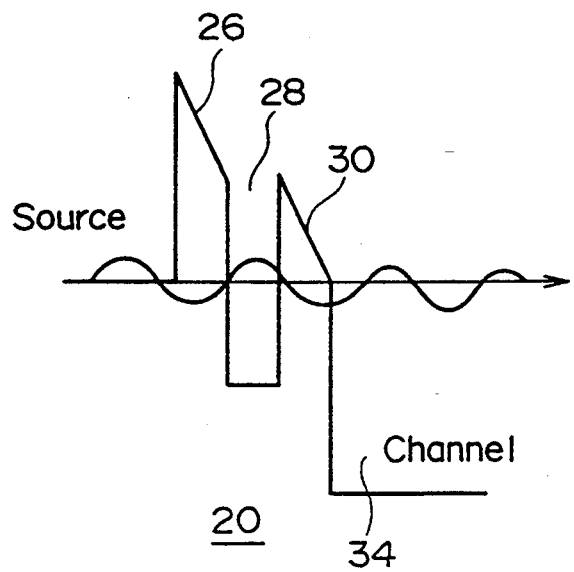
FIG. 5 is an energy band diagram of the resonant tunneling diode used in the field effect transistors of the present invention, when the resonant tunneling takes place.

Next, the operation of the FET of FIG. 3 is described. As in the conventional FET shown in FIG. 1, the source electrode 24 is held at the ground potential, whereas the bias voltage $V_d$ is applied to the drain electrode 19. Then, a voltage of a certain magnitude is applied across the RTD 20. For a certain value of $V_d$, the band diagram of the RTD 20 is as shown in FIG. 5. Due to the resonant tunneling effect, only those hot electrons which have a particular energy are permitted to pass through the dual potential barriers created by the barrier layers 26 and 30 and enter in the channel region 34 immediately beneath the gate.

The electrons supplied to the channel region 34 are at a particular energy level as stated above, and they are hot electrons accelerated to a high speed. Accordingly, these electrons can pass through the channel region 34 immediately beneath the gate at a high speed. Because the electrons which enter into the channel region beneath the gate are only electrons at a particular energy level which can cause resonant tunneling, undesirable scattering in the input side is suppressed. Accordingly, the FET shown in FIG. 3 can operate at a high speed and with low noise. As in the case of conventional FET's, the quantity of electrons flowing through the channel can be modulated by controlling the voltage applied to the gate electrode 16 to thereby vary the effective thickness of the channel.

The FET according to the first embodiment of the present invention shown in FIG. 3 is satisfactory for practical use in view of operating speed and noise. However, because the channel layer 14 is formed of an n-type semiconductor such as n-type GaAs, electrons within the channel have a degree of freedom not only in the desired x direction but also in the y direction perpendicular to the x direction so that they could be subjected to scattering in the y direction and hot electrons accelerated in the x direction could be decelerated. Thus, the operating speed could be lowered, and noise could be generated due to electron scattering.

Figure 6:
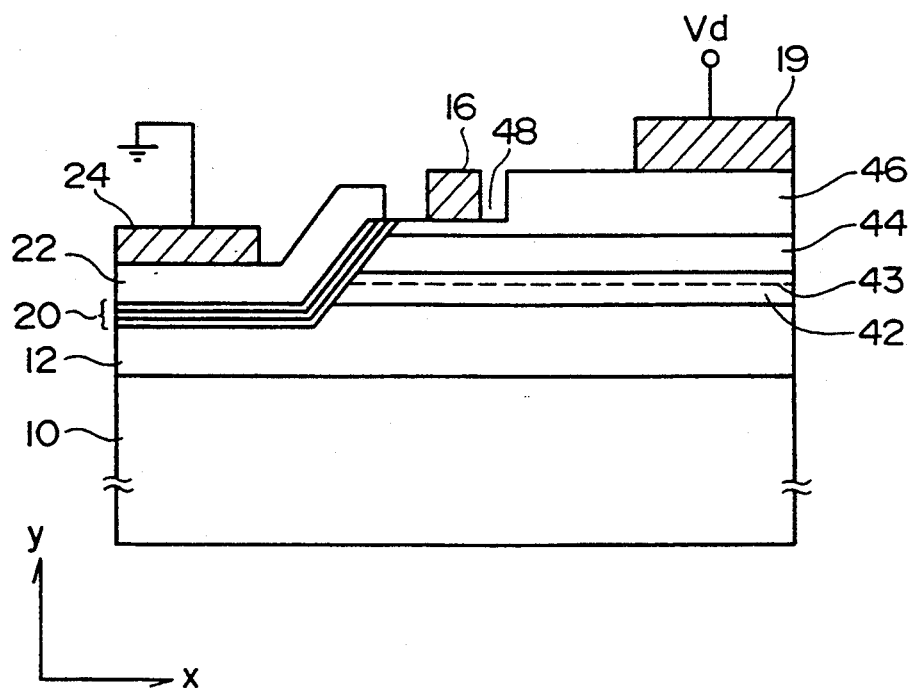
FIG. 6 is a simplified cross-sectional view of a field effect transistor according to a second embodiment of the present invention.

This problem may be overcome in the FET according to a second embodiment of the present invention shown in FIG. 6. In this FET shown in FIG. 6, one degree of freedom of electrons in the x direction in the channel is deprived, and electrons are two-dimensionally confined. The FET of FIG. 6 is an HFET (heterojunction field effect transistor), which includes, like the FET of FIG. 3, a semi-insulating semiconductor substrate 10 of, for example, GaAs, and a high-resistivity buffer layer 12 disposed on the substrate 10. On a portion of the high-resistivity buffer layer 12, an undoped channel layer 42 of, for example, GaAs, InGaAs or the like is disposed. An electron supply layer 44 of, for example, Si-doped n+-type AlGaAs, and an n+-type contact layer 46 are stacked in the named order on the undoped channel layer 42. A recess 48 is formed in the n+-type contact layer 46, and a gate electrode 16 is disposed in the recess 48. On the n+-type contact layer 46, at one end, a drain electrode 19 is disposed.

On the remaining portion of the high-resistivity buffer layer 12, a resonant tunneling diode (RTD) 20 is formed. The end of the RTD 20 on the undoped channel layer 42 side extends obliquely, contacting the end surfaces of the undoped channel layer 42, electron supply layer 44 and contact layer 46. As in the case of the FET shown in FIG. 3, it is desirable for the RTD 20 of the FET of FIG. 6 to extend perpendicular to and in contact with the top and bottom end surfaces of the undoped channel layer 42. However, for manufacturing reasons, the RTD 20 is formed obliquely as shown.

Figure 2:
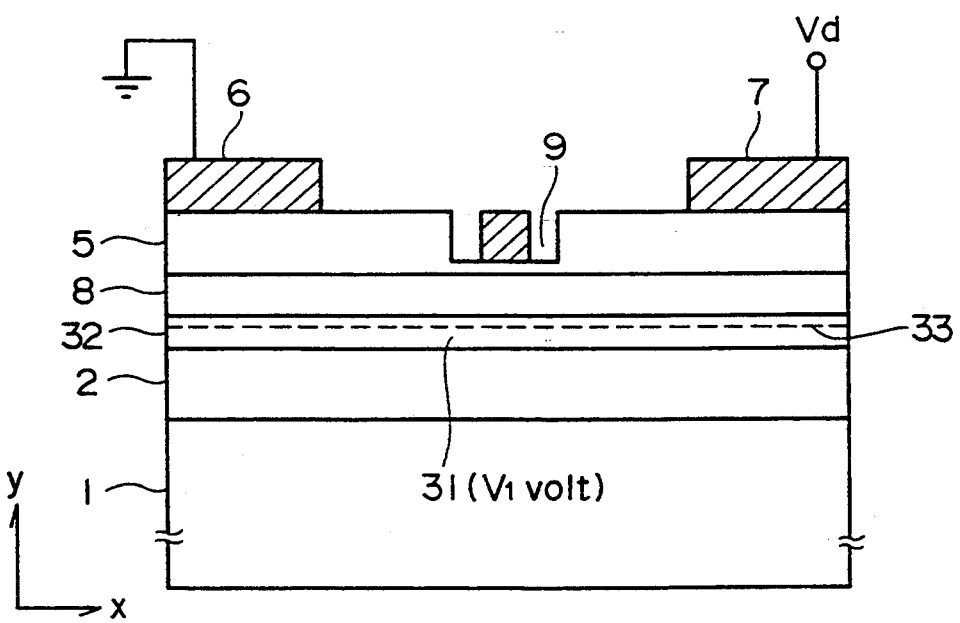
FIG. 2 is a simplified cross-sectional view of a second example of conventional field effect transistors.

As with the case of the conventional FET shown in FIG. 2, a broken line 43 shown extending through the undoped channel layer 43 represents a two-dimensional electron gas formed by electrons which are supplied from the larger bandgap, smaller electron affinity n+-type electron supply layer 44 to the smaller bandgap, larger electron affinity undoped channel layer 42 and are confined in a potential well in the channel layer 42 due to a quantum mechanical effect. The HFET of this structure is operated under substantially the same bias condition as the FET shown in FIG. 3. When a voltage of a certain magnitude is applied across the RTD 20 in response to the bias voltage $V_d$ applied to the drain electrode 19, a band diagram for the RTD 20 similar to the one shown in FIG. 5 will result. Then, due to the resonant tunneling effect, only those hot electrons which have a particular energy are permitted to pass through the dual potential barriers formed by barrier layers corresponding to the barrier layers 26 and 30 and to enter at a high speed into the channel region immediately beneath the gate. In addition, in the FET of FIG. 6, the electrons confined in the potential well are deprived of the degree of freedom in the y direction due to the hereto-barrier between the undoped channel layer 42 and the electron supply layer 44. Then, electrons which enter from the RTD 20 into the channel region and which are converted to hot electrons are more effectively accelerated in the x direction and flow to the drain electrode 19. Thus, the FET of FIG. 6 can operate at a faster speed and with less noise.

FIG. 7 illustrates a modification of the FET shown in FIG. 3. The FET of FIG. 7 includes an additional RTD 23 between the drain electrode 19 and the n+-type contact layer 18. Alternatively, the RTD 23 may be disposed between the n+-type contact layer 18 and the n-type channel layer 14, as shown in FIG. 9.

FIG. 8 shows a modification of the HFET shown in FIG. 6. As with the case of the FET shown in FIG. 7, the HFET of FIG. 8 includes an additional RTD 23 disposed between the drain electrode 19 and the n+-type contact layer 46.

By virtue of the RTD additionally disposed in the drain side in the FET's of FIGS. 7 and 8, higher speed, lower noise operation is realized in the output side of the FET.

It should be understood that in the FET's shown in FIGS. 7 and 8, it is possible to form the RTD in the drain side at a beveled edge of the channel, like the RTD in the source side.

In summary, according to the present invention, a RTD which supplies hot electrons to the channel is disposed between the source electrode and the channel region beneath the gate electrode of a FET, or such RTD's are disposed between the source electrode and the channel region beneath the gate electrode and between the drain electrode and the channel region beneath the gate electrode, respectively. Accordingly, the electrons supplied into the channel are accelerated to a significantly high initial speed, which enables the FET to operate at a high speed and with reduced noise. Furthermore, in the HFET embodying the present invention, electrons are two-dimensionally confined within a potential well so that their dispersion in the y direction, which is perpendicular to the channel direction is suppressed, and, accordingly, a further increase of the operation speed and a further reduction of noise are possible.

What is claimed is:

1. A Schottky gate field effect transistor comprising:
   a channel layer;
   a gate electrode disposed on and contacting said channel layer;
   a drain electrode and a first contact layer successively arranged on said channel layer, spaced from said gate electrode, with said first contact layer contacting said channel layer;

a source electrode spaced from said gate electrode and on an opposite side of said gate electrode from said drain electrode;

a second contact layer contacting said source electrode; and a first resonant tunneling diode disposed between and contacting said second contact layer and said channel layer, opposite said source electrode, and extending beyond said source electrode toward said gate electrode but ending between said source electrode and said gate electrode for supplying hot electrons to a region of said channel layer opposite said gate electrode, said second contact layer and said first resonant tunneling diode being interposed between said source electrode and said channel layer, said first resonant tunneling diode comprising two barrier layers having a first energy band gap sandwiching a potential well layer having a second energy band gap smaller than the first energy band gap, said barrier layers and said potential well layer including a first portion substantially parallel to said channel layer and a second portion oblique to said channel layer, one of said barrier layers contacting said channel layer where said barrier layer is oblique to said channel layer.

2. A heterojunction field effect transistor comprising:

an undoped semiconductor channel layer having an energy bandgap;

a semiconductor electron supply layer disposed on said undoped channel layer, said electron supply layer having an energy bandgap larger than the energy bandgap of said undoped channel layer;

a gate electrode disposed on said electron supply layer;

a drain electrode and a first contact layer successively arranged on said electron supply layer, said drain electrode being spaced from said gate electrode, and said first contact layer contacting said electron supply layer and said gate electrode;

a source electrode spaced from said gate electrode and disposed on an opposite side of said gate electrode from said drain electrode;

a second contact layer contacting said source electrode; and a first resonant tunneling diode disposed between and contacting said second contact layer and said channel layer, opposite said source electrode, and extending beyond said source electrode toward said gate electrode but ending between said source electrode and said gate electrode for supplying hot electrons to a channel region of said undoped channel layer opposite said gate electrode, said second contact layer and said first resonant tunneling diode being interposed between said source electrode and said channel layer, said first resonant tunneling diode comprising two barrier layers having a first energy band gap sandwiching a potential well layer having a second energy band gap smaller than the first energy band gap, said barrier layers and said potential well layers including a first portion substantially parallel to said channel layer and a second portion oblique to said channel layer, one of said barrier layers contacting said channel layer where said barrier layer is oblique to said channel layer.

3. A Schottky gate field effect transistor according to claim 2 including a second resonant tunneling diode disposed between and contacting said drain electrode and said first contact layer and extending beyond said drain electrode toward said gate electrode but ending between said drain electrode and said gate electrode.

4. The Schottky gate field effect transistor according to claim 1 wherein said channel layer comprises GaAs said barrier layers are AlGaAs and said potential well layer is undoped GaAs.

5. The Schottky gate field effect transistor according to claim 3 wherein said channel layer comprises GaAs and said barrier layers are AlGaAs and said potential well layers are undoped GaAs.

6. A Schottky gate field effect transistor comprising:

a channel layer;

a gate electrode disposed on and contacting said channel layer;

a drain electrode and a firs contact layer successively arranged on said channel layer, spaced from said gate electrode, with said first contact layer contacting said channel layer;

a source electrode spaced from said gate electrode and on an opposite side of said gate electrode from said drain electrode;

a second contact layer contacting said source electrode; and a first resonant tunneling diode disposed between and contacting said second contact layer and said channel layer, opposite said source electrode, and extending beyond said source electrode toward said gate electrode but ending between said source electrode and said gate electrode for supplying hot electrons to a region of said channel layer opposite said gate electrode, said second contact layer and said first resonant tunneling diode being interposed between said source electrode and said channel layer, said first resonant tunneling diode comprising two metal layers and a dielectric layer disposed between said metal layers, said metal layers and said dielectric layer including a first portion substantially parallel to said channel layer and a second portion oblique to said channel layer, one of said metal layers contacting said channel layer where said metal layer is oblique to said channel layer.

7. The Schottky gate field effect transistor according to claim 6 including a second resonant tunneling diode disposed between and contacting said drain electrode and said first contact layer and extending beyond said drain electrode toward said gate electrode but ending between said drain electrode and said gate electrode and wherein each of said first and second resonant tunneling diodes comprises two metal layers and a dielectric layer disposed between said metal layers.

8. The heterojunction field effect transistor according to claim 2 including a second resonant tunneling diode disposed between and contacting said first contact layer and said drain electrode and extending beyond said drain electrode toward said gate electrode but ending between said drain electrode and said gate electrode.

9. The heterojunction field effect transistor according to claim 2 wherein said channel layer comprises GaAs, said barrier layers are AlGaAs, and said potential well layer is undoped GaAs.

10. The heterojunction field effect transistor according to claim 8 wherein said channel layer comprises GaAs, said barrier layers are AlGaAs, and said potential well layers are undoped GaAs.

11. A heterojunction field effect transistor comprising:

an undoped semiconductor channel layer having an energy bandgap;

a semiconductor electron supply layer disposed on said undoped channel layer, said electron supply layer having an energy bandgap larger than the energy bandgap of said undoped channel layer;

a gate electrode disposed on said electron supply layer;

a drain electrode and a first contact layer successively arranged on said electron supply layer, said drain electrode being spaced from said gate electrode, and said first contact layer contacting said electron supply layer and said gate electrode;

a source electrode spaced from said gate electrode and disposed on an opposite side of said gate electrode from said drain electrode;

a second contact layer contacting said source electrode; and a first resonant tunneling diode disposed between and contacting said second contact layer and said channel layer, opposite said source electrode, and extending beyond said source electrode toward said gate electrode but ending between said source electrode and said gate electrode for supplying hot electrons to a channel region of said undoped channel layer opposite said gate electrode, said second contact layer and said first resonant tunneling diode being interposed between said source electrode and said channel layer, said first resonant tunneling diode comprising two metal layers and a dielectric layer disposed between said metal layers, said metal layers and said dielectric layer including a first portion substantially parallel to said channel layer and a second portion oblique to said channel layer, one of said metal layers contacting said channel layer where said metal layer is oblique to said channel layer.

12. The heterojunction field effect transistor according to claim 11 including a second resonant tunneling diode disposed between and contacting said first contact layer and said drain electrode and extending beyond said drain electrode toward said gate electrode but ending between said drain electrode and said gate electrode wherein each of said first and second resonant tunneling diodes comprises two metal layers and a dielectric layer disposed between said metal layers.

13. The Schottky gate field effect transistor according to claim 1 including a second resonant tunneling diode disposed between and contacting said first contact layer and said channel layer and extending beyond said drain electrode toward said gate electrode but ending between said drain electrode and said gate electrode.

14. The Schottky gate field effect transistor according to claim 1 including a high resistivity substrate and a buffer layer disposed on said substrate wherein said channel layer is disposed on and in contact with said buffer layer and said first resonant tunneling diode is disposed between and in contact with said second contact layer and said buffer layer.

15. The heterojunction field effect transistor according to claim 2 including a semiconductor substrate and a buffer layer disposed on said substrate wherein said channel layer is disposed on and in contact with said buffer layer and said resonant tunneling diode is disposed between and in contact with said second contact layer and said buffer layer.

* * * * *

UNITED STATES PATENT AND TRADEMARK OFFICE
CERTIFICATE OF CORRECTION

PATENT NO. : 5,428,224
DATED : June 27, 1995
INVENTOR(S) : Hayashi et al.

It is certified that error appears in the above-indentified patent and that said Letters Patent is hereby corrected as shown below:

Column 7, Line 60, change "layers" to --layer--.

Column 8, Line 16, change "firs" to --first--.

Signed and Sealed this

Twelfth Day of September, 1995

Attest:

BRUCE LEHMAN

Attesting Officer        Commissioner of Patents and Trademarks